United States Patent
Hasegawa et al.

(10) Patent No.: US 8,320,154 B2
(45) Date of Patent: Nov. 27, 2012

(54) SWITCHING ELEMENT AND APPLICATION OF THE SAME

(75) Inventors: Tsuyoshi Hasegawa, Tsukuba (JP); Masakazu Aono, Tsukuba (JP); Fumiko Yano, Tsukuba (JP); Kazuya Terabe, Tsukuba (JP); Toru Tsuruoka, Tsukuba (JP); Tomoko Ebihara, Tsukuba (JP); Takuji Ogawa, Okazaki (JP); Hirofumi Tanaka, Okazaki (JP); Takami Hino, Okazaki (JP)

(73) Assignee: National Institute for Materials Science, Ibaraki (JP)

( * ) Notice: Subject to any disclaimer, the term of this patent is extended or adjusted under 35 U.S.C. 154(b) by 245 days.

(21) Appl. No.: 12/672,151

(22) PCT Filed: Aug. 8, 2008

(86) PCT No.: PCT/JP2008/064328
§ 371 (c)(1),
(2), (4) Date: Apr. 13, 2010

(87) PCT Pub. No.: WO2009/020210
PCT Pub. Date: Feb. 12, 2009

(65) Prior Publication Data
US 2011/0273920 A1 Nov. 10, 2011

(30) Foreign Application Priority Data
Aug. 8, 2007 (JP) .................................. 2007-207166

(51) Int. Cl.
*G11C 13/00* (2006.01)
(52) U.S. Cl. .......................... 365/113; 365/112; 365/114
(58) Field of Classification Search ................... 365/113, 365/112, 114
See application file for complete search history.

(56) References Cited

U.S. PATENT DOCUMENTS

| 2004/0057323 A1* | 3/2004 | Tanabe ........................... 365/232 |
| 2005/0243844 A1* | 11/2005 | Aono et al. .................... 370/401 |
| 2006/0102927 A1 | 5/2006 | Fujita et al. |
| 2007/0284610 A1 | 12/2007 | Kawaura et al. |

FOREIGN PATENT DOCUMENTS

| JP | 2-61895 | 3/1990 |
| JP | 2002-76325 | 3/2002 |
| JP | 2002-141494 | 5/2002 |
| JP | 2002-334989 | 11/2002 |
| JP | 2003-94227 | 4/2003 |
| JP | 2006-173555 | 6/2006 |
| JP | 2008-857 | 1/2008 |
| WO | 2006/070698 | 7/2006 |

OTHER PUBLICATIONS

International Search Report issued Sep. 9, 2008 in corresponding International Application No. PCT/JP2008/064328.

* cited by examiner

*Primary Examiner* — Huan Hoang
(74) *Attorney, Agent, or Firm* — Wenderoth, Lind & Ponack, L.L.P.

(57) ABSTRACT

A micro-switching element provided with a first electrode 4 containing an ionic conductor and a second electrode 5 composed of an electric conductor, wherein the first electrode 4 and the second electrode 5 are physically and electrically connected to each other through deposition of a metal ion from the ionic conductor, and wherein a photoresponsive film 9 that receives light to generate a carrier is disposed between the first electrode 4 and the second electrode 5 to fill up the space between the electrodes. Accordingly, a micro-switching element is provided of which the characteristic fluctuation is small and which hardly produces a problem of operation failure.

10 Claims, 4 Drawing Sheets

SWITCHING ELEMENT AND APPLICATION OF THE SAME

TECHNICAL FIELD

The present invention relates to a switching element and application of the same.

BACKGROUND ART

Heretofore, as micro-switching elements, proposed are those provided with a first electrode including an ionic conductor and a second electrode composed of an electric conductor (see Patent Document 1 (JP-A 2002-76325 (paragraphs [0011] to [0019]), Patent Document 2 (JP-A 2002-141494 (paragraphs [0030] to [0089]), Patent Document 3 (JP-A 2002-334989 (paragraphs [0017] to [0059]), Patent Document 4 (JP-A 2003-094227)). For example, Patent Reference 1 discloses a switching element in which the metal ion in the first electrode is deposited from the surface of the first electrode toward the second electrode by the tunneling current between the first electrode and the second electrode generated through voltage application between the electrodes whereby the electrodes are physically and electrically connected to each other by the deposited metal, and in which the physical connection and the electric connection can be cut off by reversed voltage application.

In Patent Documents 2, 3 and 4, proposed is fabrication of operational circuits, logic circuits and memory devices through electric and reversible control of the resistance between the electrodes by arranging a plurality of the above-mentioned switching elements.

DISCLOSURE OF THE INVENTION

In the micro-switching element of such type in which the two electrodes are physically and electrically connected to each other through deposition of metal from the ionic conductor, the tunneling current to flow through voltage application stabilizes the metal ion as the deposited metal, and the electrodes are electrically connected to each other by the deposited metal. Accordingly, in case where practicable applied voltage and operation time are estimated, the distance between the two electrodes is most suitably from a few atomic layers to tens atomic layers, and this corresponds to from 1 to a few nanometers.

However, it is difficult to form uniformly a plurality of such microstructures on an atomic order, and fluctuation in the distance between the two electrodes is inevitable.

On the other hand, in case where such switching elements are integrated to fabricate operational circuits, logic circuits and memory devices, it is desirable that the constitutive switching elements have uniform electric characteristics. However, as mentioned above, the distance between the two electrodes fluctuates, and therefore, for example, the time for electric connection between the two electrodes under the condition of predetermined voltage application thereto may also fluctuate, and the circuits and the memory devices fabricated by integrating the switching elements could not exhibit the expected performance.

On the other hand, a micro-switching element for electrically connecting two electrodes to each other through deposition of metal from an ionic conductor can be used as a memory device by defining state "1" and state "0" depending on the connected condition or the non-connected condition of the two electrodes. In reading out from the memory device, a voltage is applied between the two electrodes, and from the current value flowing between the electrodes or the resistance between the electrodes, the connection condition or the non-connected condition is detected.

The applied voltage in this stage is preferably under the condition not changing the resistance value between the two electrodes of the switching element, or that is under the condition having no influence on the state of the deposited metal; however, even though a smallest possible voltage is applied, the metal ion moves as the voltage is applied, and therefore, the possibility that the condition of the deposited metal may change could not be excluded. Long-term use of a memory device, or that is, during the period of writing, erasing or reading out data in and from the device repeatedly many times, some slight state change of the deposited metal may be accumulated, therefore bringing about the possibility that the condition of the switching element may change unintentionally from the connected condition to the non-connected condition, or from the non-connected condition to the connected condition.

Further, a micro-switching element for electrically connecting two electrodes to each other through deposition of metal from an ionic conductor can be used as a part of wiring changeable to an electronic circuit. However, an ultrafine wire of the deposited metal connects the electrodes to each other in the connected condition, and therefore, the resistance value in the connected condition is higher than that in ordinary wiring, and the resistance fluctuation is large. Therefore, the electronic circuit with such wiring often causes a problem of operation failure such as delay or electric connection breakage.

The present invention has been made in consideration of the above-mentioned situation, and its object is to provide a switching element of which the characteristic fluctuation is small and which hardly generates operation failure, and to provide a memory device and an operational device using the switching element.

To solve the above-mentioned problems, the present invention is a micro-switching element provided with a first electrode containing an ionic conductor and a second electrode composed of an electric conductor, wherein the first electrode and the second electrode are physically and electrically connected to each other through deposition of a metal ion from the ionic conductor, and wherein a photoresponsive film that receives light to generate a carrier is disposed between the first electrode and the second electrode to fill up the space between the electrodes.

As the ionic conductor for the first electrode, for example, usable is a metal sulfide or a metal oxide. Concretely, the metal sulfide includes silver sulfide, copper sulfide, zinc sulfide, aluminium sulfide, etc. The metal oxide includes tungsten oxide, tantalum oxide, ruthenium oxide, etc.

As the electric conductor for the second electrode, usable is a metal or the like excellent in electroconductivity, for example, including platinum, gold, copper, etc.

Preferably, the photoresponsive film is formed of a material that comprises a substance of which the conductivity increases through photoirradiation. As the material, usable is a π-conjugated molecular film, a film of a transition metal complex having a π-conjugated molecule, a composite film containing metal fine particles of a transition metal complex having a π-conjugated molecule, or a photoconductive semiconductor film. Concretely, the π-conjugated molecular film includes a perylene-diimide film, a nucleic acid polymer film, a polyphenylene-ethynylene film, etc. The film of a transition metal complex having a π-conjugated molecule includes a Ru-phen complex film, a phthalocyanine complex film, etc.

The photoconductive semiconductor film includes a selenium compound, an indium-gallium-arsenic compound, etc.

The second electrode may be any of a transparent, semi-transparent or opaque one composed of an electric conductor; however, for a structure in which the photoresponsive film is irradiated with external light having passed through the second electrode, the second electrode is composed of a transparent electric conductor. In this case, as the material of the transparent electric conductor, usable are indium oxide, zinc oxide, tin oxide, or their mixtures, etc.

The space between the ionic conductor part of the first electrode and the second electrode is preferably at most 80 nm, from the viewpoint of preventing resistance fluctuation and preventing operation failure such as delay or electric connection breakage in use in electronic circuits, etc.; and its lowermost limit is preferably 3 nm, more preferably 5 nm, even more preferably 10 nm.

Regarding the wavelength of the light with which the photoresponsive film is irradiated, preferred is UV light, visible light or IR light within a wavelength range of from 200 nm to 2 µm from the viewpoint of good carrier generation. The photoirradiation intensity may be determined suitably from the viewpoint of good carrier generation; and in general, it may be from 0.1 µW to 1 W or so.

The voltage to be applied between the first electrode and the second electrode may be generally from 0.01 to 10 V or so.

According to the invention, there is provided a memory device provided with the above-mentioned switching element and a light source for enabling the photoresponsive film of the switching element to generate a carrier, which records information based on the connected condition and the non-connected condition between the first electrode and the second electrode therein.

Further, according to the invention, there is provided an operational device provided with a plurality of the above-mentioned switching elements and a light source for enabling the photoresponsive film of the switching element to generate a carrier, which carries out an operation between signals based on the connected condition and the non-connected condition between the first electrode and the second electrode therein.

According to the invention, the space between the first electrode and the second electrode is filled up with a photoresponsive film, and in switching from the non-connected condition to the connected condition, a voltage is applied between the two electrodes and simultaneously the photoresponsive film is irradiated with light to generate a carrier, and the deposition of metal from the ionic conductor is accelerated through the carrier supply.

In that manner, a carrier can be generated in the photoresponsive film through photoirradiation and the deposition of metal from the ionic conductor can be accelerated through the carrier supply, and therefore in case where practicable voltage application and operating time are estimated, the distance between the first electrode and the second electrode can be broadened as compared with a case where an ordinary insulation film is used. As a result, when worked with accuracy on the same level, the property fluctuation of the individual switching elements of the invention can be reduced as compared with that of the structure comprising an ordinary insulation film, and the circuit device and the memory device with the switching elements of the invention integrated therein can exhibit the expected performance.

When used in a memory device, the distance between the first electrode and the second electrode is broad as compared with a case where an ordinary insulation film is used, and therefore, even though the condition of the deposited metal may change through voltage application between electrodes in reading out, the condition of the switching element does not unintentionally change from the connected to the non-connected condition or from the non-connected condition to the connected condition in long-term use.

Further, in use as a part of reconfigurable wiring in an electronic circuit, the metal deposition is accelerated through supply of the carrier generated from the photoresponsive film by photoirradiation, and therefore, the two electrodes can be rapidly and firmly connected to each other with the result that the resistance between the electrodes can be reduced and the wiring characteristic on the same level as that in ordinary wiring can be expected.

BEST MODE FOR CARRYING OUT THE INVENTION

Embodiments of the invention are described hereinafter with reference to the drawings.

First Embodiment

Figure 1:
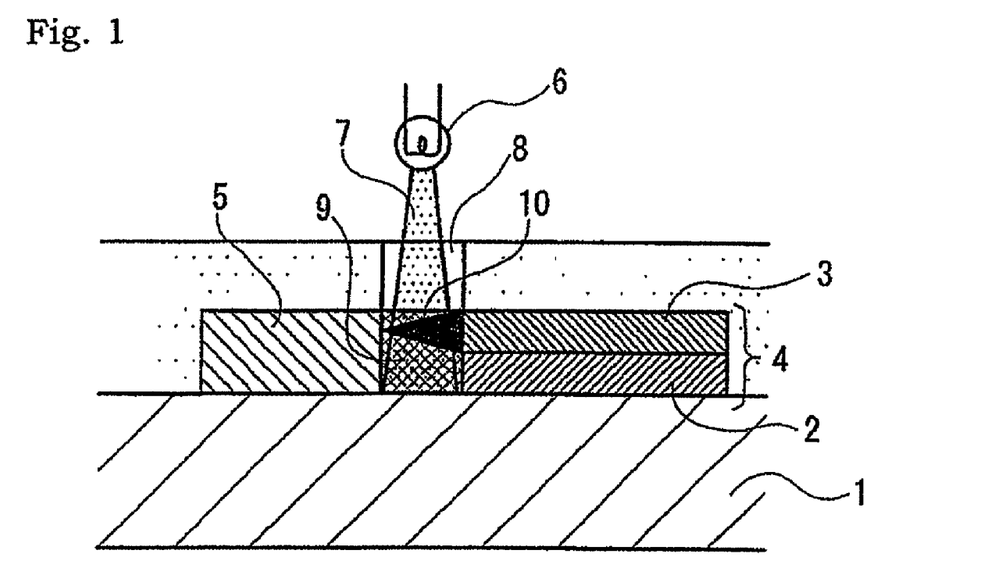
FIG. 1 is a cross-sectional view schematically showing a switching element of the first embodiment of the invention.

FIG. 1 is a cross-sectional view schematically showing a switching element (photoassisted switching element) of the first embodiment of the invention. As illustrated in the drawing, the switching element comprises a first electrode 4 and a second electrode 5 provided on an insulating substrate 1, in which these electrodes are disposed in a line with interval therebetween on the insulating substrate 1.

The first electrode 4 is composed of a first electrode electric conductor part 2 and a first electrode ionic conductor part 3, and the first electrode ionic conductor part 3 is formed, as laminated on the first electrode electric conductor part 2.

Between the first electrode 4 and the second electrode 5, disposed is a photoresponsive film 9 so as to fill up the space between the electrodes, more concretely, so as to fill up the space between the first electrode ionic conductor part 3 of the first electrode 4 and the second electrode 5. The photoresponsive film 9 is so designed that external light can come therein from the upper side via a light-transmissive insulation film 8. The periphery around the light-transmissive insulation film 8 is shielded from light. Not providing the light-transmissive insulation film 8, a hole may be formed in an upper position of the photoresponsive film 9 so that light can come in the photoresponsive film 9 through the hole.

A light source 6 is disposed outside the switching element, and the light 7 from the light source 6 runs through the light-transmissive insulation film 8 to come in the photoresponsive film 9.

The switching element of this embodiment configured as above moves in the manner mentioned below, when a voltage is applied between the first electrode 4 and the second electrode 5.

A voltage is so applied that the second electrode 5 can be a negative electrode relative to the first electrode 4. Further, the light 7 from the external light source 6 is led to run through the light-transmissive insulation film 8 to reach the photoresponsive film 9 that fills up the space between the first electrode ionic conductor part 3 and the second electrode 5, whereupon the photoresponsive film 9 generates a carrier. The electron in the carrier flows in the first electrode 4 and bonds to the metal ion in the first electrode ionic conductor part 3 to deposit a metal around the surface of the first electrode ionic conductor part 3 thereby forming a metal deposit part 10.

The metal deposit part 10 continues to grow through successive voltage application and photoirradiation, and when its tip reaches the second electrode 5, then the first electrode 4 and the second electrode 5 are physically and electrically in a connected condition.

The metal deposition process does not require a tunneling electron flow between the first electrode 4 and the second electrode 5, and the metal deposit part 10 can be formed through carrier generation from the photoresponsive film 9. The carrier supply rate from the photoresponsive film 9 determines the growth speed of the metal deposit part 10, and therefore, the shape of the metal deposit part 10, or that is, the length and the thickness thereof can be controlled by the amount and the wavelength of the light 7 from the light source 6 and by the material of the photoresponsive film 9.

On the other hand, in the condition where the first electrode 4 and the second electrode 5 are electrically connected to each other via the metal deposit part 10, a voltage is so applied that the second electrode 5 can be a positive electrode relative to the first electrode 4. Further, the light 7 from the external light source 6 is led to run through the light-transmissive insulation film 8 to reach the photoresponsive film 9 that fills up the space between the first electrode ionic conductor part 3 and the second electrode 5, whereupon the photoresponsive film 9 generates a carrier and the hole in the carrier flows to the first electrode 4 through the metal deposit part 10. The current ionizes the metal atom that forms the metal deposit part 10, and the formed ion moves to the first electrode 4.

While the ionization reaction goes on through successive voltage application and photoirradiation, the tip of the metal deposit part 10 separates from the second electrode 5, and thus, the first electrode 4 and the second electrode 5 is thereby in a non-connected condition; and after further ionization reaction, the metal deposit part 10 entirely disappears.

As in the above, the switching operation can be attained by alternately switching the polarity of the voltage to be applied between the first electrode 4 and the second electrode 5 as combined with photoirradiation.

In that manner, according to this embodiment, the growth of the metal deposit part 10 can be accelerated through supply of the carrier generated in the photoresponsive film 9 irradiated with the light 7, and further, the growth speed can be controlled. Moreover, the condition of the first electrode 4 and the second electrode 5 that are arranged as spaced from each other by tens atomic layers or more can be rapidly switched from the non-connected condition to the connected condition, and from the connected condition to the non-connected condition, and the connection between the two can be stabilized and the resistance therebetween can be reduced.

Second Embodiment

Figure 2:
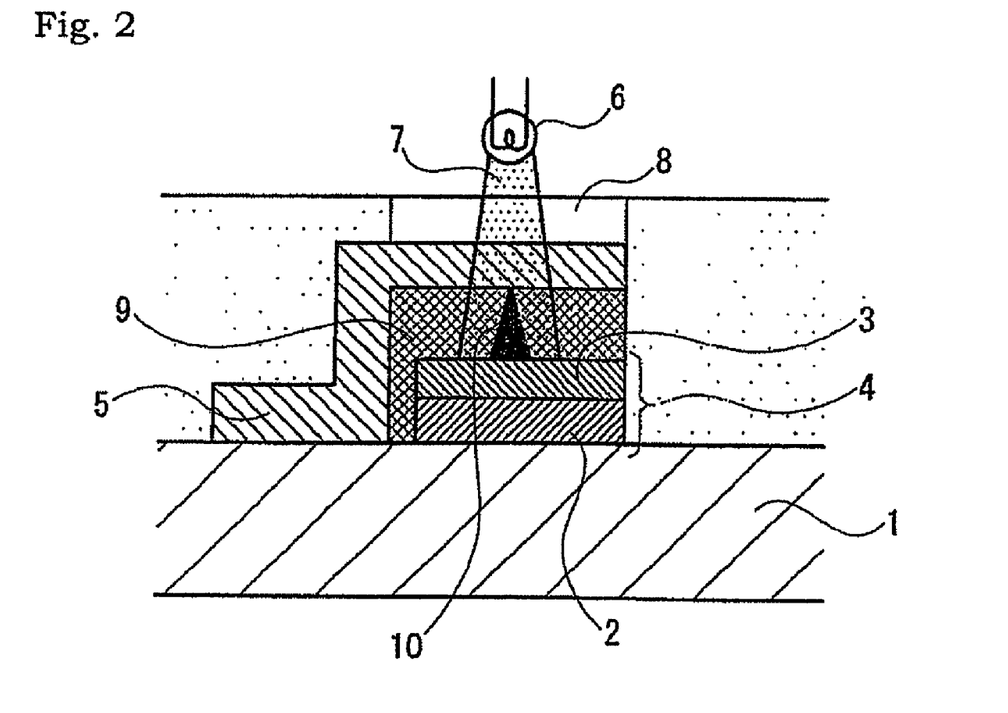
FIG. 2 is a cross-sectional view schematically showing a switching element of the second embodiment of the invention.

FIG. 2 is a cross-sectional view schematically showing a switching element (photoassisted switching element) of the second embodiment of the invention. In this embodiment, the constitutive components common to those in the first embodiment are given the same reference numerals or signs.

As illustrated in the figure, the switching element comprises a first electrode 4 and a second electrode 5 formed on an insulating substrate 1. The first electrode 4 is composed of a first electrode electric conductor part 2 and a first electrode ionic conductor part 3, and the first electrode ionic conductor part 3 is formed, as laminated on the first electrode electric conductor part 2. The second electrode 5 is composed of a transparent electric conductor.

Between the first electrode 4 and the second electrode 5, disposed is a photoresponsive film 9 so as to fill up the space between the electrodes; and in the region of the light-receiving part of the photoresponsive film 9, the first electrode ionic conductor part 3 of the first electrode 4, the photoresponsive film 9 and the second electrode 5 are laminated in that order.

The upper position of the second electrode 5 is made to receive external light via a light-transmissive insulation film 8. The periphery around the light-transmissive insulation film 8 is shielded from light. Not providing the light-transmissive insulation film 8, a hole may be formed in an upper position of the second electrode 5 so that light can come in the photoresponsive film 9 through the hole.

A light source 6 is disposed outside the switching element, and the light 7 from the light source 6 runs through the second electrode 5 of a transparent electric conductor via the light-transmissive insulation film 8 to come in the photoresponsive film 9.

The switching element of this embodiment configured as above operates in the manner mentioned below, when a voltage is applied between the first electrode 4 and the second electrode 5.

A voltage is so applied that the second electrode 5 can be a negative electrode relative to the first electrode 4. Further, the light 7 from the external light source 6 is led to run through the light-transmissive insulation film 8 and the second electrode 5 to reach the photoresponsive film 9 that fills up the space between the first electrode ionic conductor part 3 and the second electrode 5, whereupon the photoresponsive film 9 generates a carrier. The electron in the carrier flows in the first electrode 4 and bonds to the metal ion in the first electrode ionic conductor part 3 to deposit a metal around the surface of the first electrode ionic conductor part 3 thereby forming a metal deposit part 10.

The metal deposit part 10 continues to grow through successive voltage application and photoirradiation, and when its tip reaches the second electrode 5, then the first electrode 4 and the second electrode 5 are physically and electrically in a connected condition.

The metal deposition process does not require a tunneling electron flow between the first electrode 4 and the second electrode 5, and the metal deposit part 10 can be formed through carrier generation from the photoresponsive film 9. The carrier supply rate from the photoresponsive film 9 determines the growth speed of the metal deposit part 10, and therefore, the shape of the metal deposit part 10, or that is, the length and the thickness thereof can be controlled by the amount and the wavelength of the light 7 from the light source 6 and by the material of the photoresponsive film 9.

On the other hand, in the condition where the first electrode 4 and the second electrode 5 are electrically connected to each other via the metal deposit part 10, a voltage is so applied that the second electrode 5 can be a positive electrode relative to the first electrode 4. Further, the light 7 from the external light source 6 is led to run through the light-transmissive insulation film 8 to reach the photoresponsive film 9 that fills up the space between the first electrode ionic conductor part 3 and the second electrode 5, whereupon the photoresponsive film 9 generates a carrier and the hole in the carrier flows to the first electrode 4 through the metal deposit part 10. The current ionizes the metal atom that forms the metal deposit part 10, and the formed ion moves to the first electrode 4.

While the ionization reaction goes on through successive voltage application and photoirradiation, the tip of the metal deposit part 10 separates from the second electrode 5, and thus, the first electrode 4 and the second electrode 5 is thereby in a non-connected condition; and after further ionization reaction, the metal deposit part 10 entirely disappears.

As in the above, the switching operation can be attained by alternately switching the polarity of the voltage to be applied between the first electrode 4 and the second electrode 5 as combined with photoirradiation.

In that manner, according to this embodiment, the growth of the metal deposit part 10 can be accelerated through supply of the carrier generated in the photoresponsive film 9 irradiated with the light 7, and further, the growth speed can be controlled. Moreover, the condition of the first electrode 4 and the second electrode 5 that are arranged as spaced from each other by tens atomic layers or more can be rapidly switched from the non-connected condition to the connected condition, and from the connected condition to the non-connected condition, and the connection between the two can be stabilized and the resistance therebetween can be reduced.

Third Embodiment

Figure 3:
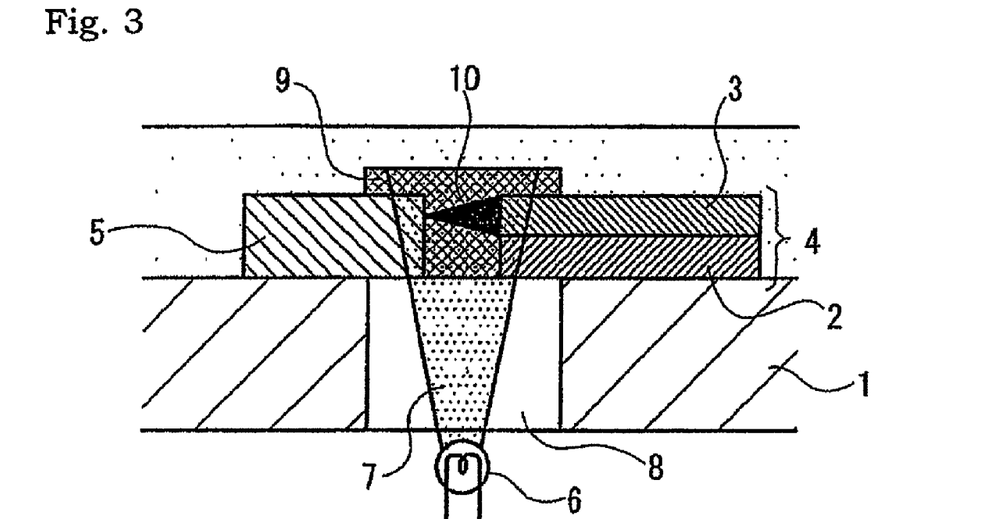
FIG. 3 is a cross-sectional view schematically showing a switching element of the third embodiment of the invention.

FIG. 3 is a cross-sectional view schematically showing a switching element (photoassisted switching element) of the third embodiment of the invention. In this embodiment, the constitutive components common to those in the first embodiment are given the same reference numerals or signs.

As illustrated in the figure, the switching element comprises a first electrode 4 and a second electrode 5 formed on an insulating substrate 1, in which these electrodes are disposed in a line with interval therebetween on the insulating substrate 1.

The first electrode 4 is composed of a first electrode electric conductor part 2 and a first electrode ionic conductor part 3, and the first electrode ionic conductor part 3 is formed, as laminated on the first electrode electric conductor part 2.

Between the first electrode 4 and the second electrode 5, disposed is a photoresponsive film 9 so as to fill up the space between the electrodes, more concretely, so as to fill up the space between the first electrode ionic conductor part 3 of the first electrode 4 and the second electrode 5. The photoresponsive film 9 is so disposed that external light can come therein from the lower side via a light-transmissive insulation film 8 that runs through the insulating substrate 1. The periphery around the light-transmissive insulation film 8 is shielded from light by the insulating substrate 1. Not providing the light-transmissive insulation film 8, a hole may be formed in the insulating substrate 1 in a position below the photoresponsive film 9 so that light can come in the photoresponsive film 9 through the hole.

A light source 6 is disposed outside the switching element, and the light 7 from the light source 6 runs through the light-transmissive insulation film 8 to come in the photoresponsive film 9.

The switching element of this embodiment configured as above operates in the manner mentioned below, when a voltage is applied between the first electrode 4 and the second electrode 5.

A voltage is so applied that the second electrode 5 can be a negative electrode relative to the first electrode 4. Further, the light 7 from the external light source 6 is led to run through the light-transmissive insulation film 8 to reach the photoresponsive film 9 that fills up the space between the first electrode ionic conductor part 3 and the second electrode 5, whereupon the photoresponsive film 9 generates a carrier. The electron in the carrier flows in the first electrode 4 and bonds to the metal ion in the first electrode ionic conductor part 3 to deposit a metal around the surface of the first electrode ionic conductor part 3 thereby forming a metal deposit part 10.

The metal deposit part 10 continues to grow through successive voltage application and photoirradiation, and when its tip reaches the second electrode 5, then the first electrode 4 and the second electrode 5 are physically and electrically in a connected condition.

The metal deposition process does not require a tunneling electron flow between the first electrode 4 and the second electrode 5, and the metal deposit part 10 can be formed through carrier generation from the photoresponsive film 9. The carrier supply rate from the photoresponsive film 9 determines the growth speed of the metal deposit part 10, and therefore, the shape of the metal deposit part 10, or that is, the length and the thickness thereof can be controlled by the amount and the wavelength of the light 7 from the light source 6 and by the material of the photoresponsive film 9.

On the other hand, in the condition where the first electrode 4 and the second electrode 5 are electrically connected to each other via the metal deposit part 10, a voltage is so applied that the second electrode 5 can be a positive electrode relative to the first electrode 4. Further, the light 7 from the external light source 6 is led to run through the light-transmissive insulation film 8 to reach the photoresponsive film 9 that fills up the space between the first electrode ionic conductor part 3 and the second electrode 5, whereupon the photoresponsive film 9 generates a carrier and the hole in the carrier flows to the first electrode 4 through the metal deposit part 10. The current ionizes the metal atom that forms the metal deposit part 10, and the formed ion moves to the first electrode 4.

While the ionization reaction goes on through successive voltage application and photoirradiation, the tip of the metal deposit part 10 separates from the second electrode 5, and thus, the first electrode 4 and the second electrode 5 is thereby in a non-connected condition; and after further ionization reaction, the metal deposit part 10 entirely disappears.

As in the above, the switching operation can be attained by alternately switching the polarity of the voltage to be applied between the first electrode 4 and the second electrode 5 as combined with photoirradiation.

In that manner, according to this embodiment, the growth of the metal deposit part 10 can be accelerated through supply of the carrier generated in the photoresponsive film 9 irradiated with the light 7, and further, the growth speed can be controlled. Moreover, the condition of the first electrode 4 and the second electrode 5 that are arranged as spaced from each other by tens atomic layers or more can be rapidly switched from the non-connected condition to the connected condition, and from the connected condition to the non-connected condition, and the connection between the two can be stabilized and the resistance therebetween can be reduced.

Fourth Embodiment

Figure 4:
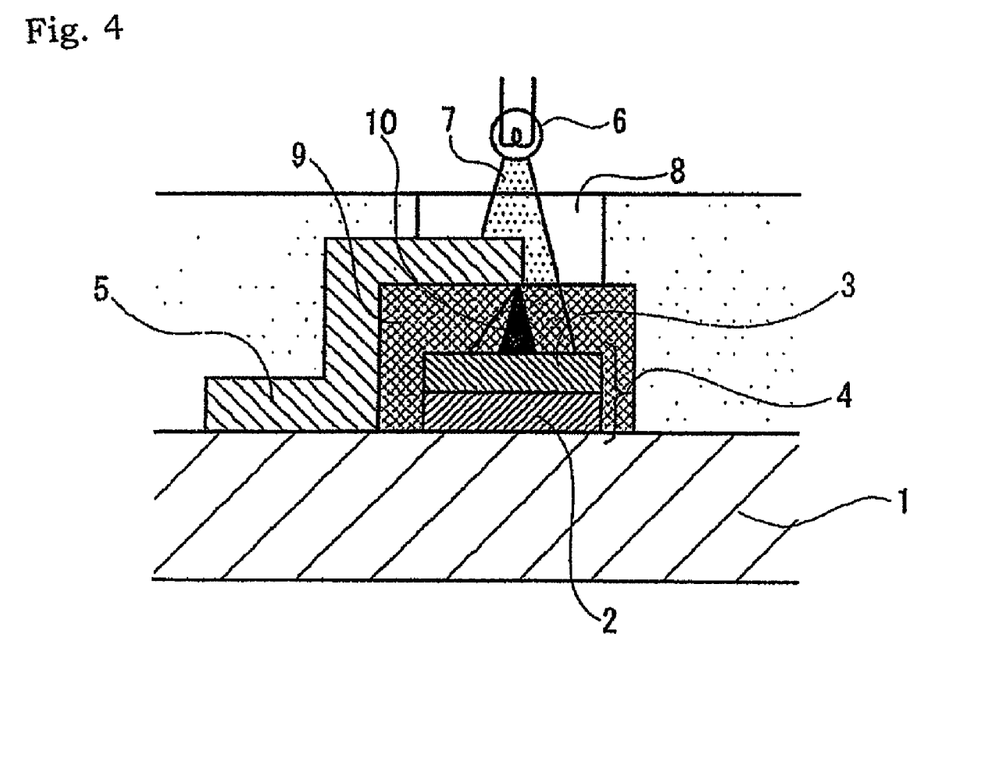
FIG. 4 is a cross-sectional view schematically showing a switching element of the fourth embodiment of the invention.

FIG. 4 is a cross-sectional view schematically showing a switching element (photoassisted switching element) of the fourth embodiment of the invention. In this embodiment, the constitutive components common to those in the first embodiment are given the same reference numerals or signs, and their explanation is omitted.

As illustrated in the figure, the switching element comprises a first electrode 4 and a second electrode 5 formed on an insulating substrate 1. The first electrode 4 is composed of a first electrode electric conductor part 2 and a first electrode ionic conductor part 3, and the first electrode ionic conductor part 3 is formed, as laminated on the first electrode electric conductor part 2.

Between the first electrode 4 and the second electrode 5, disposed is a photoresponsive film 9 so as to fill up the space between the electrodes; and on the first electrode ionic conductor part 3 of the first electrode 4, a photoresponsive film 9 and a second electrode 5 are laminated in that order. The upper face of the photoresponsive film 9 is partly covered with the second electrode 5, and the part thereof not covered with the second electrode 5 is exposed above.

The upper position of the exposed part of the photoresponsive film 9 is made to receive the light 7 from the external light source 6 via a light-transmissive insulation film 8. The second electrode 5 adjacent to the exposed part to cover the upper face of the photoresponsive film 9 faces the light-transmissive insulation film 8; however, the second electrode 5 blocks up the light 7 from the light source 6. Not providing the light-transmissive insulation film 8, a hole may be formed in a position above the photoresponsive film 9 so that light can come in the photoresponsive film 9 through the hole.

The switching element of this embodiment configured as above operates in the manner mentioned below, when a voltage is applied between the first electrode 4 and the second electrode 5.

A voltage is so applied that the second electrode 5 can be a negative electrode relative to the first electrode 4. Further, when the light 7 from the external light source 6 is irradiated, then the light 7 runs through the light-transmissive insulation film 8 and comes in the photoresponsive film 9 through the exposed part thereof not covered with the second electrode 5. In this stage, the light 7 passing near the second electrode 5 may partly come in the region of the photoresponsive film 9 covered with the second electrode 5, owing to the diffraction effect of the light 7. When the photoresponsive film 9 is irradiated with the light 7, then the photoresponsive film 9 generates a carrier. The electron in the carrier flows in the first electrode 4 and bonds to the metal ion in the first electrode ionic conductor part 3 to deposit a metal around the surface of the first electrode ionic conductor part 3 thereby forming a metal deposit part 10.

The metal deposit part 10 continues to grow through successive voltage application and photoirradiation, and when its tip reaches the second electrode 5, then the first electrode 4 and the second electrode 5 are physically and electrically in a connected condition.

The metal deposition process does not require a tunneling electron flow between the first electrode 4 and the second electrode 5, and the metal deposit part 10 can be formed through carrier generation from the photoresponsive film 9. The carrier supply rate from the photoresponsive film 9 determines the growth speed of the metal deposit part 10, and therefore, the shape of the metal deposit part 10, or that is, the length and the thickness thereof can be controlled by the quantity and the wavelength of the light 7 from the light source 6 and by the material of the photoresponsive film 9.

On the other hand, in the condition where the first electrode 4 and the second electrode 5 are electrically connected to each other via the metal deposit part 10, a voltage is so applied that the second electrode 5 can be a positive electrode relative to the first electrode 4. Further, the light 7 from the external light source 6 is led to run through the light-transmissive insulation film 8 to reach the photoresponsive film 9 that fills up the space between the first electrode ionic conductor part 3 and the second electrode 5, whereupon the photoresponsive film 9 generates a carrier and the hole in the carrier flows to the first electrode 4 through the metal deposit part 10. The current ionizes the metal atom that forms the metal deposit part 10, and the formed ion moves to the first electrode 4.

While the ionization reaction goes on through successive voltage application and photoirradiation, the tip of the metal deposit part 10 separates from the second electrode 5, and thus, the first electrode 4 and the second electrode 5 is thereby in a non-connected condition; and after further ionization reaction, the metal deposit part 10 entirely disappears.

As in the above, the switching operation can be attained by alternately switching the polarity of the voltage to be applied between the first electrode 4 and the second electrode 5 as combined with photoirradiation.

In that manner, according to this embodiment, the growth of the metal deposit part 10 can be accelerated through supply of the carrier generated in the photoresponsive film 9 irradiated with the light 7, and further, the growth speed can be controlled. Moreover, the condition of the first electrode 4 and the second electrode 5 that are arranged as spaced from each other by tens atomic layers or more can be rapidly switched from the non-connected condition to the connected condition, and from the connected condition to the non-connected condition, and the connection between the two can be stabilized and the resistance therebetween can be reduced.

Fifth Embodiment

Figure 5:
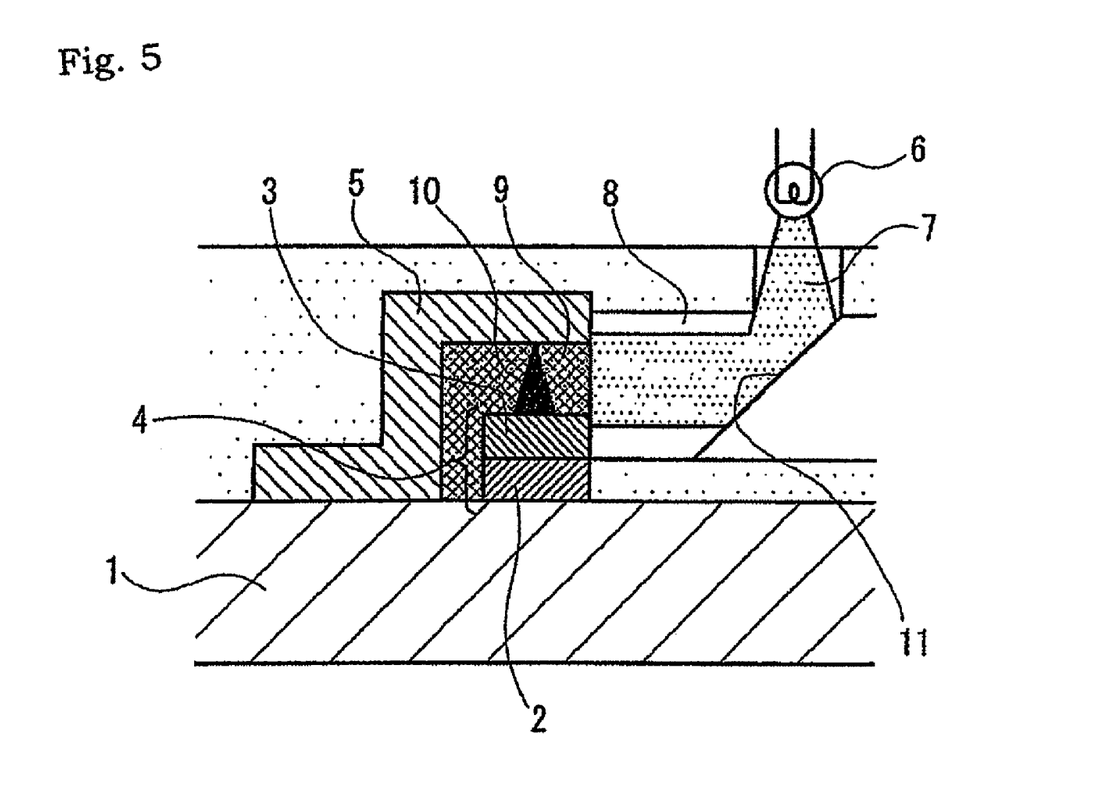
FIG. 5 is a cross-sectional view schematically showing a switching element of the fifth embodiment of the invention.

FIG. 5 is a cross-sectional view schematically showing a switching element (photoassisted switching element) of the fifth embodiment of the invention. In this embodiment, the constitutive components common to those in the first embodiment are given the same reference numerals or signs.

As illustrated in the figure, the switching element comprises a first electrode 4 and a second electrode 5 formed on an insulating substrate 1. The first electrode 4 is composed of a first electrode electric conductor part 2 and a first electrode ionic conductor part 3, and the first electrode ionic conductor part 3 is formed, as laminated on the first electrode electric conductor part 2.

Between the first electrode 4 and the second electrode 5, disposed is a photoresponsive film 9 so as to fill up the space between the electrodes; and in the region of the light-receiving part of the photoresponsive film 9, the first electrode ionic conductor part 3 of the first electrode 4, the photoresponsive film 9 and the second electrode 5 are laminated in that order.

The side of the photoresponsive film 9 is adjacent to a light-transmissive insulation film 8, and the light-transmissive insulation film 8 is so disposed that it can receive the light 7 running from an external light source 6 in the direction vertical to the substrate. The incident light 7 to the light-transmissive insulation film 8 is reflected by a light reflection film 11 so that its running course is converted toward the direction parallel to the substrate, and thereafter it comes in the photoresponsive film 9 in the direction parallel to the substrate.

The switching element of this embodiment configured as above operates in the manner mentioned below, when a voltage is applied between the first electrode 4 and the second electrode 5.

A voltage is so applied that the second electrode 5 can be a negative electrode relative to the first electrode 4. Further, the light 7 from the external light source 6 is led to run through the light-transmissive insulation film 8 to reach the photoresponsive film 9 that fills up the space between the first electrode ionic conductor part 3 and the second electrode 5, in the direction parallel to the substrate, whereupon the photoresponsive film 9 generates a carrier. The electron in the carrier flows in the first electrode 4 and bonds to the metal ion in the first electrode ionic conductor part 3 to deposit a metal around the surface of the first electrode ionic conductor part 3 thereby forming a metal deposit part 10.

The metal deposit part 10 continues to grow through successive voltage application and photoirradiation, and when its tip reaches the second electrode 5, then the first electrode 4 and the second electrode 5 are physically and electrically in a connected condition.

The metal deposition process does not require a tunneling electron flow between the first electrode 4 and the second electrode 5, and the metal deposit part 10 can be formed through carrier generation from the photoresponsive film 9. The carrier supply rate from the photoresponsive film 9 determines the growth speed of the metal deposit part 10, and therefore, the shape of the metal deposit part 10, or that is, the length and the thickness thereof can be controlled by the amount and the wavelength of the light 7 from the light source 6 and by the material of the photoresponsive film 9.

On the other hand, in the condition where the first electrode 4 and the second electrode 5 are electrically connected to each other via the metal deposit part 10, a voltage is so applied that the second electrode 5 can be a positive electrode relative to the first electrode 4. Further, the light 7 from the external light source 6 is led to run through the light-transmissive insulation film 8 to reach the photoresponsive film 9 that fills up the space between the first electrode ionic conductor part 3 and the second electrode 5, whereupon the photoresponsive film 9 generates a carrier and the hole in the carrier flows to the first electrode 4 through the metal deposit part 10. The current ionizes the metal atom that forms the metal deposit part 10, and the formed ion moves to the first electrode 4.

While the ionization reaction goes on through successive voltage application and photoirradiation, the tip of the metal deposit part 10 separates from the second electrode 5, and thus, the first electrode 4 and the second electrode 5 is thereby in a non-connected condition; and after further ionization reaction, the metal deposit part 10 entirely disappears.

As in the above, the switching motion can be attained by alternately switching the polarity of the voltage to be applied between the first electrode 4 and the second electrode 5 as combined with photoirradiation.

In that manner, according to this embodiment, the growth of the metal deposit part 10 can be accelerated through supply of the carrier generated in the photoresponsive film 9 irradiated with the light 7, and further, the growth speed can be controlled. Moreover, the condition of the first electrode 4 and the second electrode 5 that are arranged as spaced from each other by tens atomic layers or more can be rapidly switched from the non-connected condition to the connected condition, and from the connected condition to the non-connected condition, and the connection between the two can be stabilized and the resistance therebetween can be reduced.

Embodiments of the invention have been described in the above; however, the invention should not be limited at all to these embodiments, and needless-to-say, the invention can be variously changed or modified within a range not overstepping the scope and the sprit thereof. For example, the number of the constitutive components, the materials thereof, the forming methods thereof, and the structures thereof can be suitably changed or modified, if desired, by anyone skilled in the art from the disclosure in the present specification.

Next described is a production example.

On an insulating substrate of a silicon oxide film, provided was a first electrode electric conductor part of platinum in a thickness of 20 nm, according to a sputtering vapor deposition method; and on this, a first electrode ionic conductor part of silver sulfide was then provided in a thickness of 30 nm according to a pulse laser deposition (PLD) method, thereby forming a first electrode. On the substrate, formed was a second electrode of platinum in a thickness of 50 nm, as spaced by 60 nm from the first electrode, according to a sputtering vapor deposition method. Between the first electrode and the second electrode, provided was a photoresponsive film according to a vacuum vapor deposition method using N,N'-diheptylperylene-tetracarborxylic diimide (PCDI). On the photoresponsive film, provided was a light-transmissive insulation film of tantalum oxide in a thickness of 30 nm, and the upper region of the first electrode and the second electrode was sealed up with a silicon oxide film, thereby fabricating the switching element having the constitution shown in FIG. 1.

Figure 6:
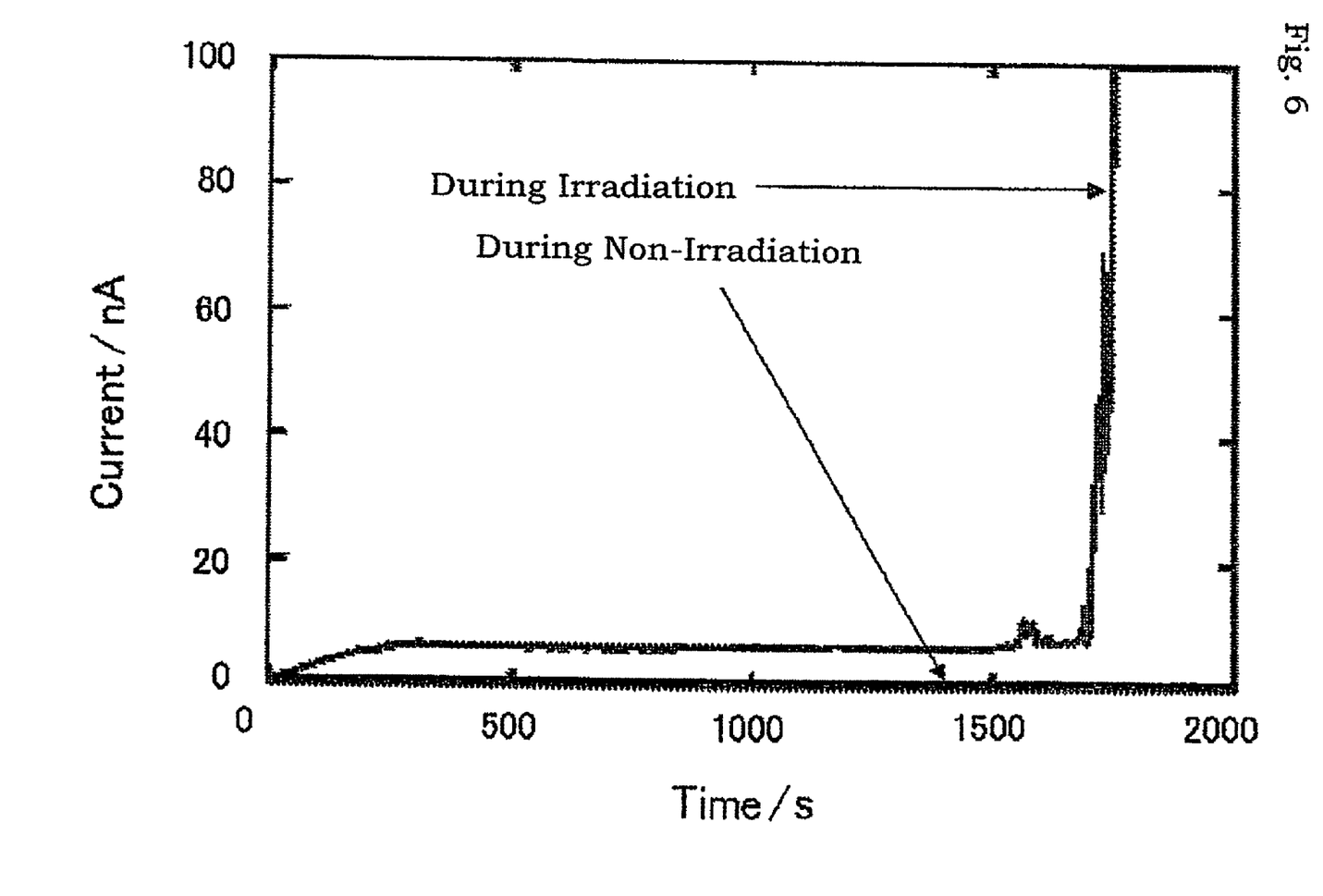
FIG. 6 is a graph showing the switching characteristic of the switching element in Example.

The switching characteristic of the switching element is shown in FIG. 6. With no photoirradiation, a voltage of −5 V was applied to the platinum electrode, but no current flow between the first electrode and the second electrode. Next, when a white light was radiated, then a current began to flow immediately after the irradiation, and after 30 minutes, the current rapidly increased. This indicates the formation of a metal bridge between the first electrode and the second electrode. The growth speed of the metal bridge depends on the intensity of the irradiated light and the strength of the applied voltage. In this Example, the growth speed of the metal bridge is relatively slow; but when a molecular film having a high level of photoresponsiveness is used, then the operation speed can be controlled.

The invention claimed is:

1. A switching element comprising:
a first electrode containing an ionic conductor;
a second electrode composed of an electric conductor; and
a photoresponsive film disposed between the first electrode and the second electrode so as to fill up a space between the first electrode and the second electrode, the photoresponsive film receiving light to generate a carrier,
wherein the first electrode and the second electrode are made to be physically and electrically connected to each other through deposition of a metal ion from the ionic conductor by applying a voltage between the first electrode and the second electrode in a first direction while irradiating light to the photoresponsive film so that an electron in the carrier can bond with the metal ion from the ionic conductor, and the first electrode and the second electrode are made to be physically and electrically disconnected through removal of the deposition by applying a voltage between the first electrode and the second electrode in a second direction opposite to the first direction while irradiating light to the photoresponsive film so that a hole in the carrier can remove the deposition after further ionization reaction.

2. The switching element as claimed in claim 1, wherein the photoresponsive film is a film of a material of which the conductivity increases through photoirradiation.

3. The switching element as claimed in claim 2, wherein the photoresponsive film is a π-conjugated molecular film, a film of a transition metal complex having a π-conjugated molecule, a composite film containing metal fine particles of a transition metal complex having a π-conjugated molecule, or a photoconductive semiconductor film.

4. The switching element as claimed in claim 1, wherein the photoresponsive film generates the carrier through irradiation with UV light, visible light or IR light having a wavelength falling within a range of from 200 nm to 2 µm.

5. The switching element as claimed in claim 1, wherein the distance between the ionic conductor contained in the first electrode and the second electrode is at most 80 nm.

6. The switching element as claimed in claim 1, wherein the ionic conductor contained in the first electrode is formed of a metal sulfide or a metal oxide.

7. The switching element as claimed in claim 1, wherein the second electrode is formed of a transparent electric conductor and the photoresponsive film is irradiated with the light that passes through the second electrode.

8. The switching element as claimed in claim 7, wherein the transparent electric conductor is indium oxide, zinc oxide, tin oxide, or their mixture.

9. A memory device provided with a plurality of switching elements of claim 1 and a light source for making the photoresponsive film of the switching element generate a carrier, which records information based on a connected condition and a non-connected condition between the first electrode and the second electrode therein.

10. An operational device provided with a plurality of switching elements of claim 1 and a light source for making the photoresponsive film of the switching element generate a carrier, which carries out an operation between signals based on a connected condition and a non-connected condition between the first electrode and the second electrode therein.

* * * * *